United States Patent
Lee et al.

(10) Patent No.: US 6,557,147 B1
(45) Date of Patent: Apr. 29, 2003

(54) METHOD AND APPARATUS FOR EVALUATING A CIRCUIT

(75) Inventors: Myeong S. Lee, San Jose, CA (US); Debendra Das Sharma, Santa Clara, CA (US); Jon Bock, Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/562,309

(22) Filed: May 1, 2000

(51) Int. Cl.[7] ............................................... G06F 17/50
(52) U.S. Cl. ......................................................... 716/4
(58) Field of Search .................. 716/2–5, 18; 379/112.01

(56) References Cited

U.S. PATENT DOCUMENTS

| | | | | | |
|---|---|---|---|---|---|
| 5,068,892 A | * | 11/1991 | Livanos | ................. | 379/112.01 |
| 5,369,647 A | * | 11/1994 | Kreifels et al. | ............. | 714/718 |
| 5,633,813 A | * | 5/1997 | Srinivasan | ................... | 714/741 |
| 5,953,519 A | * | 9/1999 | Fura | ............................. | 716/18 |
| 6,173,243 B1 | * | 1/2001 | Lowe et al. | ................... | 716/3 |

* cited by examiner

*Primary Examiner*—Matthew Smith
*Assistant Examiner*—Thuan Do

(57) ABSTRACT

An apparatus and method for performance counter verification of an electronic circuit. The apparatus and method sends a transaction to a circuit under test causing counter values to change and retrieves these counter values from the circuit under test for comparison with known or expected counter values to measure the performance of the electronic circuit under test. The apparatus and method may also generate the known or expected counter values by monitoring the transactions sent to the circuit under test. The apparatus and method may also measure elapsed time for comparison with counter values retrieved from the circuit under test. The counter values can reflect a wide variety of events, including the occurrence of certain predefined events or the amount of time that elapses between two events.

29 Claims, 5 Drawing Sheets

METHOD AND APPARATUS FOR EVALUATING A CIRCUIT

FIELD OF THE INVENTION

This invention relates to electronic systems analysis, and, more particularly, to an apparatus and method for evaluating operation of a circuit.

BACKGROUND OF THE INVENTION

Various software languages exist that are useful for the conceptual design of integrated circuits. These languages are generally known as hardware description languages and include languages such as Very High Speed Integrated Circuit (VHSIC) Hardware Description Language and Verilog, a language for electronic design and gate level simulation. These languages can be used to emulate the operation of a circuit under test. Alternatively, the circuit under test may be a final product.

Previously, in order to check performance counters on a circuit, the known method was to run a simulation, read out performance counters at the end, and check the values in the counters using a post-simulation analysis. A counter is a circuit or part of a circuit that counts specific events in an electronic system. A performance counter is a counter that can provide performance-related information such as occurrences of a particular transaction or response latency. The method described above does not allow checking of the values during run-time. The method also requires a user to perform a separate verification. Finally, this method is limited to verification of counting the number of times certain events have occurred, while performance counters themselves are able to measure a wider variety of events, such as timing counts between events or data throughput. A necessity exists for a method and apparatus which solves the aforementioned problems.

SUMMARY OF THE INVENTION

In one embodiment, the present invention is useful in checking the operation of a circuit. Such a circuit may be a software simulation of a given or proposed circuit. In certain instances this software version of the circuit may be the final product. Alternatively, the software version may be part of the design phase used in developing the circuit. The circuit may also be an actual assemblage of electronic components.

In one embodiment, the invention involves sending one or a sequence of working transactions to a circuit under test that will cause the counter values in the circuit to change and keeping and updating an expected counter value according to the transaction sent. A read transaction is then sent to the circuit, which returns the value of the counters in the circuit under test. The two values, the expected counter value and the actual counter value can then be compared.

In another embodiment, the invention involves independently and simultaneously measuring the amount of time that passes between two discreet events. In this embodiment, the system may measure how long a circuit takes to complete a given transaction. This may be done by beginning an external counter when a transaction is sent to the circuit under test and the circuit under test beginning its own internal counter once it receives that certain transaction. Thus, the external and internal counter may be independent of each other. Once the circuit under test finishes the transaction it stops its own internal counter and sends a return transaction. Upon receipt of the return transaction, the external counter stops. The two counters can then be compared, and although the external counter value will always be greater than the value returned by the internal counter due to latency between the verification system and the circuit under test, a measure of performance is obtained.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

An overview of the performance counter verification system 10 according to the present invention is described with reference to FIGS. 1, 2, 3, 4 and 5. As used herein the term "mechanism" generally refers to hardware, software or any combination thereof. The mechanisms described herein can be implemented on standard, general-purpose computers or they can be implemented as specialized devices. Additionally, the term "module" is used to refer to hardware, software or any combination thereof. It is to be understood that different modules may exist independently of one another, or maybe combined in such fashion as they are inseparable. Further, although two or more modules may be described herein as separate, each module may exist in combination with one or more other modules as suitable for a particular application.

The term "system user" as used herein refers to any individual using the performance counter verification system, or it may be software, hardware or any combination thereof configured to use the information produced by the system.

Figure 1:
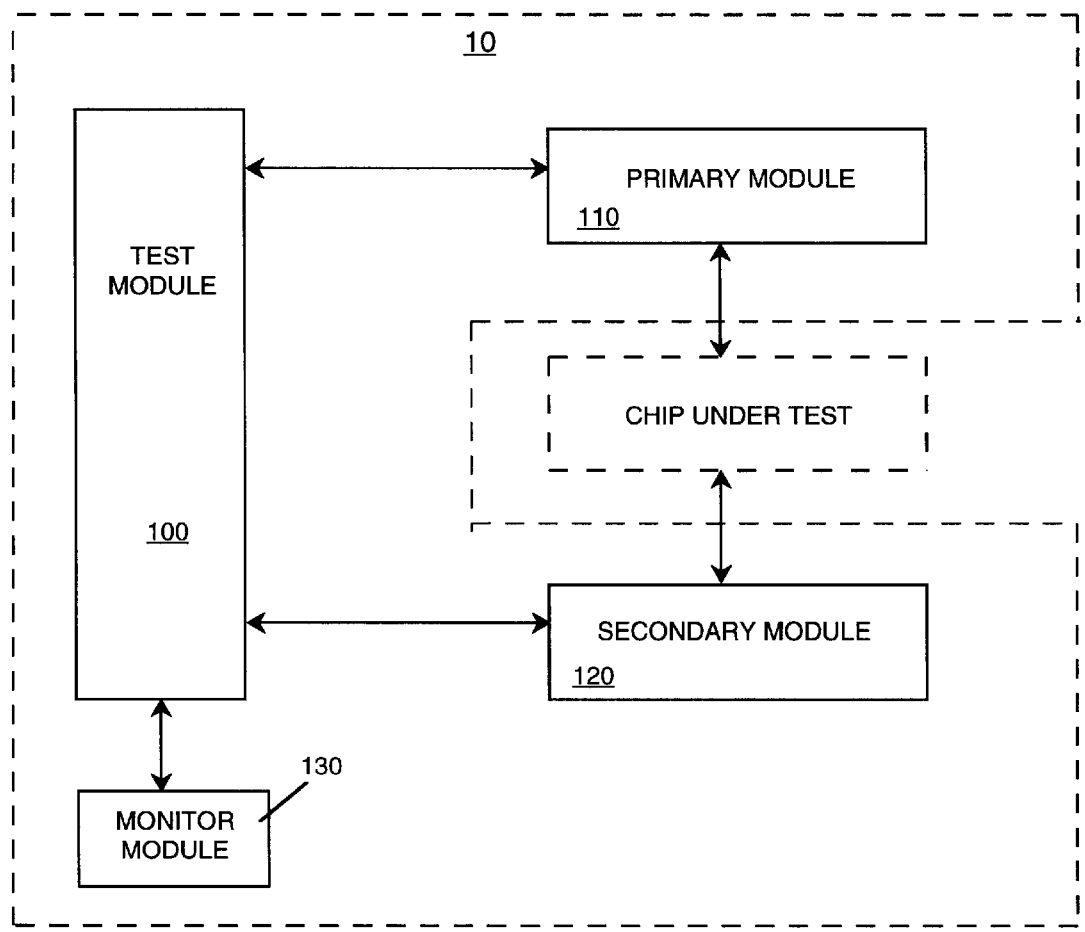
FIG. 1 is a block diagram of an electronic analysis system according to one embodiment of the present invention.

A system for verifying performance counters in a circuit under test 10 is depicted in FIG. 1. A test module 100 generates and transmits one or more transactions for use in testing a circuit. A transaction is first sent to a primary module 110 before being transmitted to the circuit under test. A secondary module 120 may receive the transaction from the circuit under test and transmit a result back to the circuit under test, which then goes to the primary module 110 and on to the test module 100. Each component may reside independently of the others, as depicted in FIG. 1.

Thus, a system which may include a variety of modules which generate and transmit certain transactions among and between the other modules and the circuit under test is disclosed. In one form, a test module 100 generates and transmits a transaction for use in testing the circuit. A primary module 110 receives the transaction and converts the transaction into a form which is executable by the circuit. A secondary module 120 receives the transaction and sends a return to the circuit under test which transmits the return back to the primary module 110, whereupon the return is sent to the test module 100. Finally, a monitor module 130 monitors the transactions generated for use in testing the circuit for comparison with the results of the executed transactions. Preferably, an error record is generated whenever the comparison or results returned by the circuit under test are unsatisfactory. Even more preferably, the error record may be generated automatically.

Alternatively, the test module 100 may transmit directly to the secondary module 120, and the transaction is then sent to the circuit under test and in certain instances on to the primary module 110. In this instance the primary module 110 may return a result to the chip under test, which is sent to the secondary module 120 and back to the test module 100.

Preferably, the primary module 110 communicates with one or more central processing units, while the secondary module 120 communicates with one or more input/output devices. The secondary module 120 may further serve a trafficking function, such that the secondary module 120 regulates the flow of data to the input/output devices to which it communicates with. This function may be served through bidirectional communication of the secondary module 120 with the circuit under test. In this way, the secondary module 120 may instruct the circuit under test to cease data throughput to allow the input/output devices to complete a prior transaction.

For purposes of this disclosure, a transaction is a sequence of information exchange and related work. Examples of a transaction might include the following functions: read, write, flush cache, or data return, among many others. A working transaction is any transaction used in testing a circuit. Such a transaction could include any and all transactions used in normal operation of a circuit, as well as transactions that only find use in testing a circuit. Such a transaction may or may not be expected to cause a change in a circuit's counter values.

Each transaction sent by the test module 100, to the circuit under test, undergoes a formatting protocol that is performed by either the primary module 110, or the secondary module 120, depending upon which module receives the particular transaction. The particular function performed by primary module 110 or secondary module 120 is determined by the transaction that it receives and the format to which it must fit the transaction for the circuit under test. If the primary module 110 receives a transaction from the test module 100 it will alter the format of the transaction as necessary for input into the circuit under test. This formatting protocol is such that the transaction is placed in a form so that it may be read and understood by the circuit under test. The primary module 110 would convert the format of the transaction received from the test module 100 into the particular bit-arrangement to which it must conform in order to be processed by the circuit under test. For example, a given circuit may require that a transaction consist of packets of data in a certain format. Each packet then includes a particular number of data bits, arranged in a particular structure. Again, by way of example, a particular packet may include a header block, 64 bytes of solid data, 60 bits of error correcting code and a 16-bit signature. The test module 100 does not generate transactions in this format, thus the transactions generated must be converted into this format. Either the primary module 110 or the secondary module 120 can perform this conversion or formatting. Similarly, the primary module 110 or the secondary module 120 can perform a second conversion or formatting, wherein the primary module 110 or secondary module 120 formats a signal sent by or through the circuit under test back to the test module 100, or on to other modules or peripheral devices. In this function, the primary module 110 or the secondary module 120 translates a packet arranged in a particular manner into a format which the test module 100, or other target module or peripheral device, can process.

The circuit under test may be any of a variety of circuits, including, but not limited to, circuits composed entirely of software. Examples of such circuits would include a circuit existing only in a software language such as Verilog, or any other tool suitable for electronic design and simulation. It should be understood that the methods and apparatus disclosed herein could work with virtually any circuit having internal counters. This would include testing an application-specific integrated circuit (ASIC). For purposes of this disclosure the term "simulated circuit" is used to refer to any circuit not embedded in silicon, whether or not such circuit includes any hardware components.

As previously indicated, the circuit includes one or more counters capable of counting discreet events. A given counter is capable of counting the occurrence of one or more of a number of different events. For example, the counters may measure elapsed time between two discreet events. This is preferably done by counting the number of cycles that elapse between the two discreet events. Alternatively, the counters may count different events which may be mathematically related to one another. For example, counters can count transactions with a header only, transactions with a header followed by two data cycles, and transactions with a header followed by seven data cycles. Counters could be configured to count an enormously wide variety of events. To illustrate the breadth of this variety, the following examples are provided, but are by no means intended to be, nor should they be interpreted as, limiting the scope of the invention described herein: the number of data cycles, number of data blocks, the number of non-idle headers, the number of idle cycles, data throughput, the number of entries in the circuit's storage mechanism and a wide variety of other events.

Each of the primary module 110, secondary module 120, and monitor module 130 may be incorporated as part of, or closely associated with, the test module 100. In such an embodiment, each module is incorporated as a part of a single larger module 10. Alternatively, the configuration could be such that one or more of the primary module 110, secondary module 120, and monitor module 130 is separate from, and entirely independent of, the test module 100. In such an embodiment, the test module 100 is associated with any of the primary module 110, the secondary module 120 and the monitor module 130 such that they may communicate with the test module 110. In yet another alternative, the configuration could be such that a given module is interrelated with and closely associated with one or more other modules.

The test module 100 may include instructions to generate and transmit transactions for use in testing the circuit. The test module 100 may also serve to receive transactions from the circuit under test and process those results. The test module 100 may include an internal counter and may be able to predict the effect of a given instruction upon the counters in a circuit under test. The transactions that the test module 100 may transmit include transactions to configure the circuit under test to count certain events, working transactions, and transactions to read and return counter values.

An example of such a working transaction would be a data request or read transaction that requires the circuit under test to return data from an address in the circuit under test, or an address in the secondary module 120 or a related input/ output device. Alternatively, the working transaction may consist of a null transaction, or a transaction that would not cause any of the counters in the circuit under test to change. Such a transaction might be useful as a negative test in diagnosing a circuit under test that has previously returned improper counter values. Further examples of working transactions would include write transactions, cache coherency transactions, synchronization transactions, and initialization transactions. Cache coherency transactions include all cache-related transactions, synchronization transactions assist the system in operating a plurality of chips or circuits by allowing them to work together and ensuring that they are all functioning in harmony, and initialization transactions include those transactions used in initializing a chip or circuit, such transactions may set internal registers, and cause each chip or circuit to verify its connections, among other things.

While the foregoing list of transactions has been provided to illustrate the breadth of transactions that may be used to test the circuit along with the invention disclosed herein, this list is not exhaustive, and it should be understood that one feature of the present invention is the variety of transactions that may be used to test a circuit.

Figure 2:
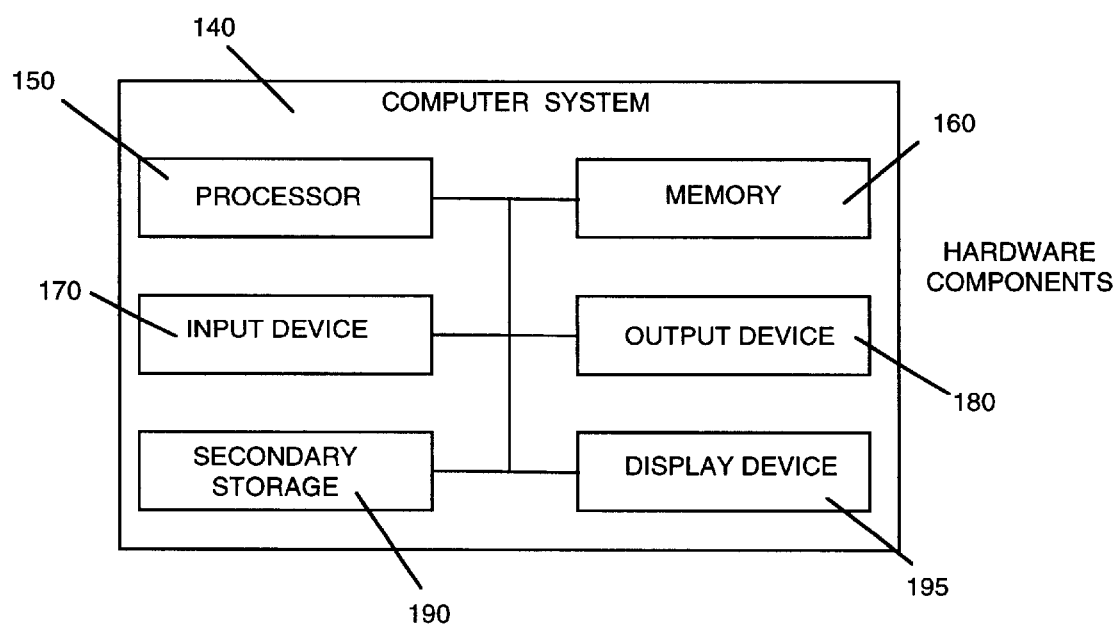
FIG. 2 is a block diagram of exemplary hardware components for implementing the electronic system.

FIG. 2 is a diagram of exemplary hardware components for implementing the system for verifying performance counters. As shown in FIG. 2, the hardware system 140 may include a processor 150, a memory 160, an input device 170, an output device 180, a secondary storage device 190, and a display device 195. Memory 160 may include RAM or similar types of memory, and it may store one or more applications or programs. Processor 150 may execute one or more applications or programs stored in memory 160 or secondary storage 190, or received from another source such as an Internet or other network connection. Input device 170 may include any device for entering information into the hardware system 140, such as a keyboard, key pad, mouse, cursor-control device, touch-screen, microphone, digital camera, video recorder or camcorder. Display device 195 may include any type of device for presenting visual information such as, for example, a computer monitor, flat-screen display, or display panel. Output device 180 may include any type of device for presenting a hard copy of information, such as a printer, and other types of output devices, including speakers or any device for providing information in audio form.

Alternatively, the system may employ various input and output devices, herein input/output which, in addition to the previously described input and output devices would include devices which serve to store and retrieve data.

Figure 3:
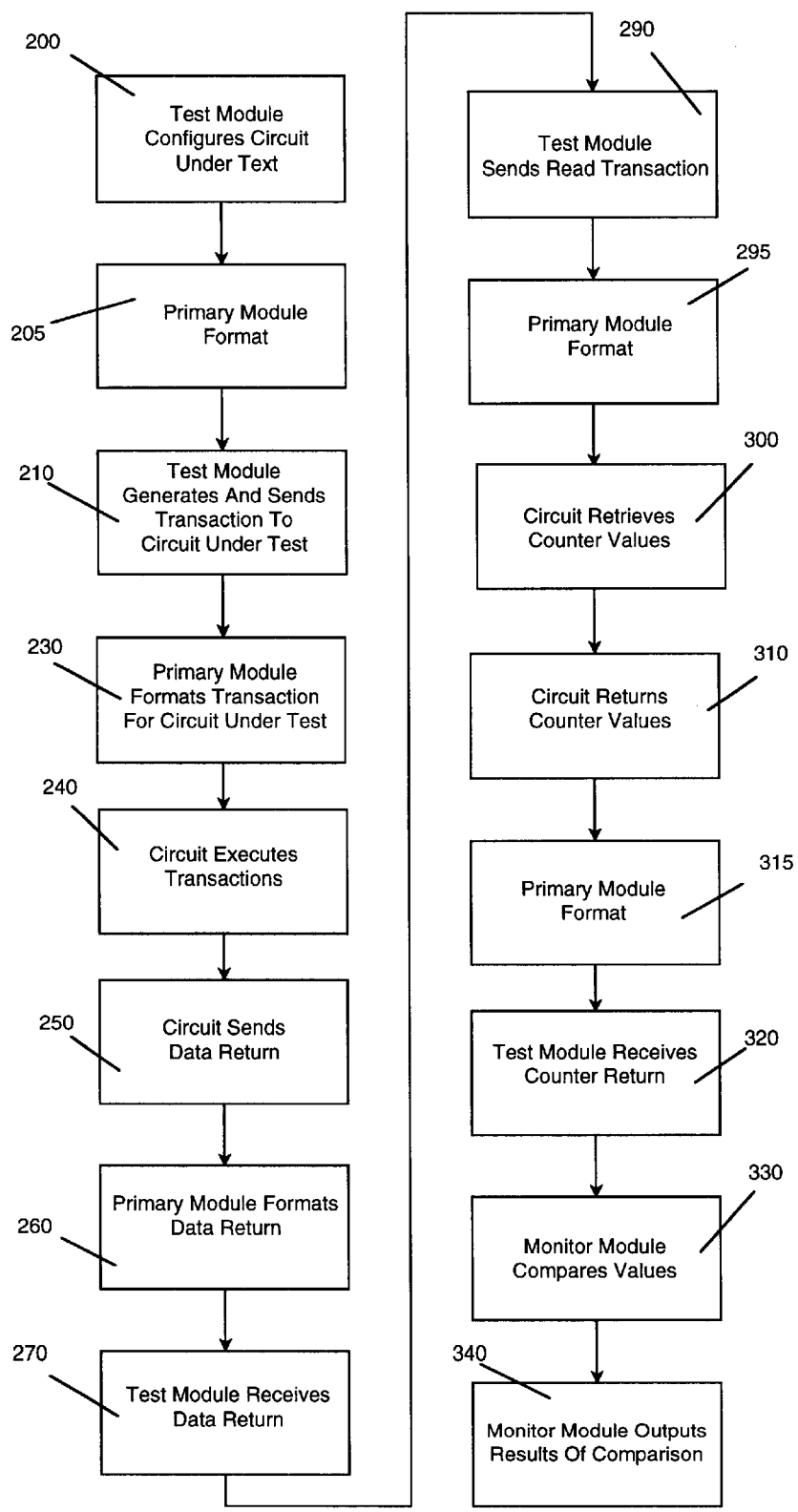
FIG. 3 is a flow chart depicting the testing of a circuit using the electronic analysis system shown in FIG. 1.

FIG. 3 is a flow chart depicting the testing of a circuit using the electronic analysis system shown in FIG. 1. In FIG. 3, the test module first sends a transaction 200 to the circuit under test to configure the counters in the circuit under test such that the circuit under test will count certain events. For example, the circuit under test could be configured to measure time between certain events. This operation is preferably performed by counting the number of cycles that occur between two events. To further illustrate, in one embodiment the circuit under test is configured to begin counting upon receipt of some working transaction and stop counting upon completion of the task assigned by the working transaction.

Before receipt by the circuit under test, the configuration transaction is formatted by the primary module 110 so that the circuit under test can use it 205. Thus, the particular function of the primary module 110 is determined by the transaction that it receives and the format to which it must fit the transaction for the circuit under test.

The configuration transaction may assign numerous tasks as it may direct a number of counters in a given circuit to track different or like events. The configuration transaction prepares the circuit for performance counter verification. Preferably, the system waits until all previous transactions have expired before beginning the performance counter verification procedures outlined herein.

The test module then sends a working transaction 210 to the primary module 110. The primary module 110 receives the working transaction and formats it so that the circuit under test can use it 230. Thus, the particular function of the primary module 110 is determined by the transaction that it receives and the format to which it must fit the transaction for the circuit under test and at the same time begins an external counting function 220. Preferably, the test module 100 and the primary module 110 are so closely related that the test module 100 can begin its external counter at the same time the transaction is sent by the primary module 110 to the circuit under test. This counting function is external to the extent that it is external to the circuit under test. In this particular embodiment, the counting function is preferably counting the number of cycles that pass before some event stopping the counter. As previously described, the working transaction may be any of a number of transactions. The circuit under test receives the working transaction and at the same time the counters in the circuit under test begin a counting function. Upon receipt of the working transaction the circuit under test begins execution of the transaction 240, while at the same time, its own internal counters are counting cycles.

Depending upon the particular transaction sent to the circuit under test, the circuit under test may need to send the transaction on to the secondary module 120. The working transaction may be a read transaction wherein the address of the data to be retrieved is within the secondary module 120 or an input/output device to which the secondary module 120 communicates with. In such an instance, the circuit under test will pass the transaction along to the secondary module 120 which then retrieves the data and returns it to the circuit under test, which returns the data to the primary module 110 which returns the data to the test module 100.

Once the circuit under test has completed the transaction it sends results of the executed transaction 250 back to the primary module 110 and ceases counting. Upon receipt of the executed transaction by the primary module 110, the test module stops its external counter. A diminished delay between stopping the external counter and receipt of the executed transaction by the primary module 110 is highly desirable. The primary module 110 reformats the results 260 so that they may be processed by the test module 100.

The test module 100 receives the results 270 of the circuit under test's performance of the transaction from the primary module 110.

The test module 100 subsequently sends a read transaction 290 to the circuit under test to read its counter values. The primary module 110 formats the read transaction for processing by the circuit under test 295. The circuit under test receives this read transaction, retrieves the counter value data 300 and returns the data 310 to the primary module 110. The primary module 110 formats the data 315 for processing by the test module 100. The test module 100 receives these counter values 320.

Alternatively, the working transaction may be a transaction other than those transactions which would cause the circuit under test to generate a response, for instance, a write transaction. In such instance, the test module 100 may simply read the counter values upon sending the write transaction or some other series of transactions, without waiting to receive a response.

The test module 100 then sends the values of the counters in the circuit under test as well as the values in the external counter to the monitor module 130. The monitor module 130 receives these values and compares them 330. The results of this comparison are then output 340 to some output device so that a user may determine the performance of the circuit under test. In certain embodiments, the monitor module 130 may be configured to return a pass or fail signal upon comparing the counter values it receives. Specifically, the monitor module 130 may be configured to associate a particular counter with its function such that the monitor module 130 will return a failure in certain instances and indicate not only which counter did not return an acceptable entry, but what the failure of that counter might represent.

In this embodiment, the counters measure time in the form of cycles. A cycle is a discreet unit of time defined as one period of a computer clock. The number of cycles that pass between two events indicate the elapsed time between the two events. Since in this embodiment, the counter in the test module 100 begins counting at the moment the transaction is sent to the circuit under test, it begins counting before the counter in the circuit under test begins counting. Further, the counter in the circuit under test ceases counting when it sends the results of the executed transaction back to the test module 100. Since the test module 100 stops counting on receipt of the executed transaction, it ceases counting after the counter in the circuit under test ceases counting. As a result, the counter in the test module should always be slightly larger than that of the counter in the circuit under test. When the test module counter value and the counter value returned by the circuit under test vary too widely, this indicates a malfunction at some point in the system. A user may ultimately conclude that the circuit under test has malfunctioned.

Alternatively, the external counter may be stopped by other methods. One such method is to combine multiple transactions between counter start and counter stop. For example, the test module 100 may generate a write transaction followed by a read transaction, starting the counter upon sending the write transaction and stopping the counter only after receipt of the results of the read transaction. In this way, even transactions that would normally not generate any return to the test module 100, such as a write transaction, may be tested. Alternatively, a series of read transactions or virtually any other combination or series of transactions of interest may be sent to the test module.

Figure 4:
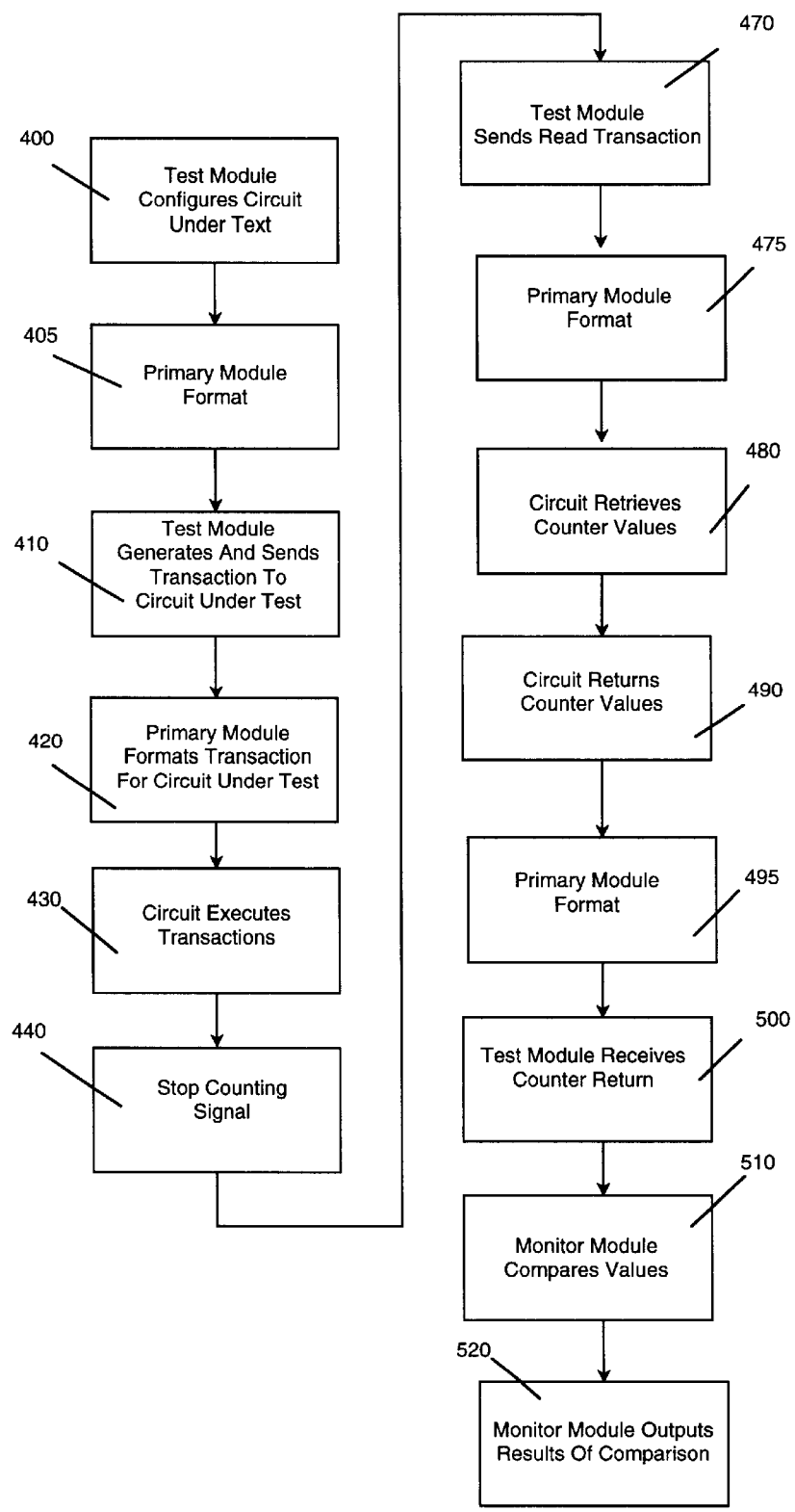
FIG. 4 is a flow chart depicting the testing of a circuit using the electronic analysis system shown in FIG. 1.

FIG. 4 is a flow chart depicting the testing of a circuit using the electronic analysis system wherein the test module 100 generates a set of counter values equivalent to those expected from the circuit under test. In this embodiment, the circuit under test could be configured to count the number of times a certain type of event occurs. In such instances the counters do not measure time, rather they provide a history of what the circuit under test has done, or what data the circuit under test has received, or some other function. The group of measurable and/or countable functions is quite large. The present system could be employed to measure and count any of these functions.

Since the transaction communicated to the counters in the circuit under test is known, as is which transaction events will cause a counter to change, the resulting change in the counters is predictable. Alternatively, the transactions being generated by the test module 100 may be monitored and counts like or similar to those the circuit under test is configured to generate may be generated by the test module 100. In this manner, the test module 100 generates a set counter values equivalent to those expected from the circuit under test.

In FIG. 4, the test module 100 first sends a transaction 400 to the circuit under test to configure the counters in the circuit under test such that the circuit under test will count certain events. This transaction is first received by the primary module 110 and formatted for processing 405 by the circuit under test before sending to the circuit under test. In this embodiment, the circuit under test is configured to measure the number of times a discreet event occurs.

The configuration transaction may assign numerous tasks as it may direct a number of counters in a given circuit to track different or like events. The configuration transaction prepares the circuit for performance counter verification. Preferably, the system waits until all previous transaction have expired before beginning the performance counter verification procedures outlined herein.

The counting function assigned to an individual counter may be related to or redundant with the counting function performed by another counter. Since many of the counters are redundant and mathematically related to one another, the monitor module 130 can be configured to diagnose certain problems within the simulated circuit. The counters are redundant to the extent that they relate to one or more other counters in such a way that knowledge of the value of one or more counters will permit a prediction of one or more other counters. This is a function of the mathematical relationship by which the counters may be assigned. The redundancy allows cross-checking of the counter values such that each redundant counter's operation may be verified.

After counter configuration, the test module 100 sends a working transaction 410 to the circuit under test. As previously described, the working transaction may be any of a number of transactions. The test module 100 simultaneously monitors the transactions being sent to the circuit under test and generates a set of simulated counter values based on the transactions being sent to the circuit under test. The simulated counter values represent those changes in counter values expected from the circuit under test due to the transactions being sent to that circuit.

The primary module 110 receives the working transaction and formats it 420 so that the circuit under test can process it.

The circuit under test receives and executes the working transaction 430 while at the same time the counters in the circuit under test begin a counting function. Upon receipt of the working transaction the circuit under test begins execution of the transaction, while at the same time, its own internal counters are counting the occurrence of one or more events. In certain instances the circuit under test may pass the working transaction along to the secondary module 120, such as when the transaction requires retrieval of data at an address accessible by the secondary module 120.

Once the circuit under test has completed the transaction it sends results of the executed transaction back to the primary module 110, when appropriate. Appropriateness is determined by the nature of the original working transaction. Where the transaction is performed by the secondary module 120 or a device attached thereto, the secondary module 120 may return the result to the circuit under test which returns the result to the primary module 110. The primary module would then reformats the return results for processing by the test module. As shown in the drawing another transaction may be sent to the circuit under test to cause it to stop counting 440, and in certain embodiments, freeze its counter values.

The test module 100 receives the results 460 of the circuit under test's performance of the transaction from the primary module 110.

The test module 100 subsequently sends a read transaction 470 to the circuit under test to read its counter values. The read transaction may be directed to one, all or a selected group of counters in the circuit under test. The primary module 110 receives and formats the read transaction 475 before sending it to the circuit under test. The circuit under test receives this read transaction, retrieves the counter values 480 and returns the values of the counters 490 to the primary module 110. The primary module 110 receives the counter value data and formats it for processing 495 by the test module. The test module 100 then receives these counter values 500.

The test module 100 then sends the values of the counters in the circuit under test as well as the values in its own counters to the monitor module 130, which compares the values in the different counters 510. The monitor module 130 may be an integrated part of the test module 100, or it may be closely associated with the test module 100, or it may be entirely separate from the test module 100 and only relate to the test module 100 via its communication therewith. The results of this comparison are then output 520 so that a user may determine the performance of the circuit under test. A circuit under test that fails to return the values expected based on transmission of a given transaction to the circuit under test indicates a problem with the counter or with the circuit under test.

In another embodiment, the verification environment may use a plurality of performance counters internal to the circuit under test to measure a set of correlated events. At the end of the test the correlation is checked among the corresponding performance counters. Here the invention utilizes the redundancy that is typically present in the design of a circuit under test.

Another embodiment involves applying stimulus such as transactions to the circuit under test such that the performance counter(s) will record the events of interest. An external agent also keeps track of those events by monitoring the activity in the boundaries of the circuit, and creates a set of external counter values. The performance counter(s) in the circuit are read at the end of the test. The internal counter values are compared to the external counter values to see if they correlate. The correlation may be such that a set of internal counter values is equal to a set of external counter values or the correlation may such that the internal counter values are greater than or lesser than the external counter values.

In yet another embodiment the performance counter(s) in the circuit under test are read directly from the circuit under test by poking the registers in the circuit under test. In this embodiment, the test module has bidirectional communication directly with the circuit under test, causing it to return its counter values to the test module. This embodiment does not utilize the formatting protocol previously described with respect to the primary and secondary module.

In another embodiment, the test module 100 sends all transactions first to the secondary module 120. The secondary module 120 then acts in similar fashion to the primary module 110 described above. The secondary module 120 formats and sends the transactions to the circuit under test, which may further send the transaction to the primary module 110 as necessary. In such instances, the primary module 110 returns a result to the circuit under test, which transmits the result to the secondary module 120, which in turn, transmits the results back to the test module 100. This approach provides greater flexibility through a wider variety of options in test configuration. A system user may perform a test or series of tests upon the system entirely different from those in which the test module 100 communicates with the primary module 110.

Alternatively, as depicted in FIG. 1, the system may be such that the test module has bidirectional communication with both the primary module 100 and the secondary module 110.

Figure 5:
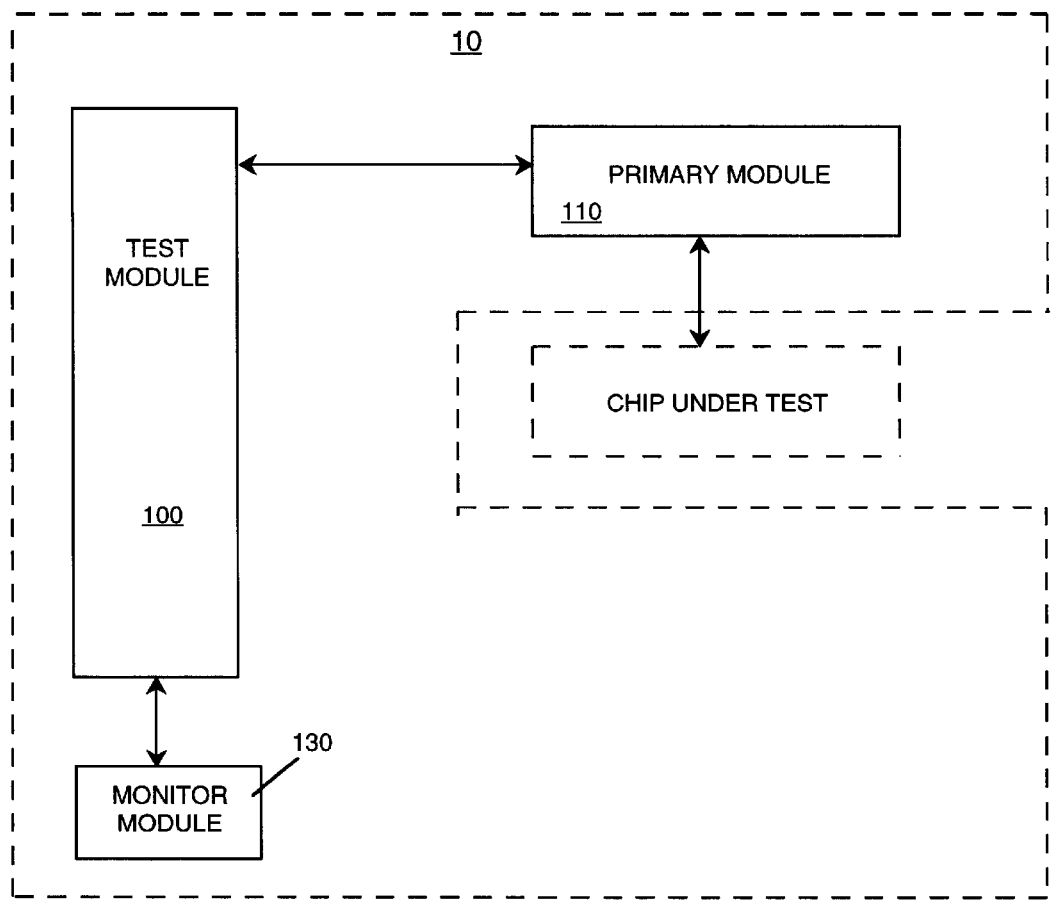
FIG. 5 is a block diagram of an electronic analysis system according to one embodiment of the present invention.

FIG. 5 depicts yet another embodiment wherein the system includes only a test module 100 and a primary module 110. This system works similarly to those previously described in FIGS. 3 and 4, however there is no secondary module. In this embodiment the working transactions sent to the circuit under test are such that the circuit under test need not communicate with any module other than the primary module 110, and may simply complete the transaction. In this embodiment, the primary module 110 could also communicate with a variety of other devices or modules, such as processing units or input/output devices.

For example, this embodiment might be used where a write transaction is used to store data at an address within the circuit under test, or where a read transaction retrieves data stored within the circuit under test. In both instances, upon completion of the transaction, the circuit under test need only communicate with the primary module 110, if at all.

In yet another embodiment that may incorporate only a primary module 110, or a primary module 110 and a secondary module 120 the circuit under test could be configured to count both cycles as well as other events. Thus, the circuit under test would effectively provide a measure of both elapsed time and the number of times a given event occurs. In order to perform both functions, the test module would employ an external counter as described, as well as a monitoring function which generates a set of counter values based on the transactions sent to the circuit under test, as described with the text directed to FIG. 4.

EXAMPLE

The following example further illustrates and exhibits certain embodiments of the invention. These example is provided in order to further clarify the invention and does not prescribe any limits, implied or otherwise, on the aforementioned methods and apparatus.

In one performance counter directed test, the circuit under test is a Verilog model of an ASIC. Transactions are sent to the circuit under test using the method shown in FIG. 4 so that Counter 0 through Counter 6 in the model ASIC are configured to count the following events:

| Counter | Event |
|---|---|
| Counter 0 | Number of all header only transactions |
| Counter 1 | Number of all header followed by two data cycle transactions |
| Counter 2 | Number of all header followed by seven data cycle transactions |
| Counter 3 | Number of non-idle headers in inbound link |

-continued

| Counter | Event |
|---|---|
| Counter 4 | Number of data cycles in inbound bus |
| Counter 5 | Number of data blocks in inbound link |
| Counter 6 | Number of idle cycles in inbound bus |

Once a transaction is completed, the values of these counters are checked using the test module 100 with a read transaction. The values of Counter 0 through Counter 2 can be predicted independent of the read transaction, by an agent aware of the transaction sent to the chip under test. The values of Counter 3 through Counter 6 can then be derived from the predicted values of Counter 0 through Counter 2. Specifically, the relationships are:

Counter 3=Counter 0+Counter 1+Counter 2

Counter 4=Counter 1+(4*Counter 2)

Counter 5=(2*Counter 1)+(7*Counter 2)

Counter 6=Total number of counting cycles−Counter 3−Counter 4

Thus, the redundancy in the counters, as configured, can be used to check the values of related performance counters.

While the invention has been described and disclosed in various terms and certain embodiments, the scope of the invention is not intended to be, nor should it be deemed to be, limited thereby and such other modifications or embodiments as may be suggested by the teachings herein are particularly reserved especially as they fall within the breadth and scope of the claims here appended and their equivalents.

What is claimed is:

1. A system for use in evaluating operation of a circuit under test comprising:

a test module which generates and transmits one or more transactions for use in testing the circuit and generates one or more external counter values for use in testing the circuit;

a primary module which may receive the transactions and convert the transactions for execution by the circuit and may receive the transaction results and convert the results for processing by the test module; and a monitor module, which analyzes the test results by comparing the external counter values to performance counter values generated by the circuit under test.

2. The system for evaluating operation of a circuit under test of claim 1 wherein the circuit under test is a simulated circuit.

3. The system for evaluating operation of a circuit under test of claim 1 further comprising:

a secondary module which receives the transaction from the circuit under test and returns a result to the circuit under test.

4. The system for evaluating operation of a circuit under test of claim 1 further comprising:

a secondary module which may also receive one or more transactions and convert the transactions for execution by the circuit and receive the transaction results and convert the results for processing by the test module.

5. The performance counter checking system of claim 4 wherein said secondary module and said primary module have bidirectional communication with the test module.

6. A system for use in evaluating operation of a circuit under test comprising:

a test module which generates and transmits a transaction for use in testing the circuit and generates at least one external counter value;

one or more modules which serve to format the transaction for execution by the circuit under test and direct the transaction so that it is executed and when necessary return a result to the test module; and monitor module which analyzes results of the executed transaction using the at least one external counter value.

7. The system for evaluating operation of a circuit under test of claim 6 wherein the test module generates and transmits multiple transactions;

the one or more modules serve to format and direct the multiple transactions, and when necessary return results to the test module; and the monitor module analyzes results of the executed transactions.

8. The system for evaluating operation of a circuit under test of claim 7 wherein the test module monitors the transactions generated for use in testing the circuit under test for comparison with the results of the executed transactions.

9. The system for evaluating operation of a circuit under test of claim 7 wherein the test module measures time between two discreet events related to the sending of a working transaction to the circuit under test, and thereafter retrieves the results of a measure of time internally measured by the circuit under test for comparison.

10. The system for evaluating operation of a circuit under test of claim 9 wherein the test module also monitors the transactions generated for use in testing the circuit for comparison with the results of internal counters within the circuit under test which monitor similar events.

11. The system for evaluating operation of a circuit under test of claim 7 wherein the test module monitors the transactions generated for use in testing the circuit for comparison with the results of internal counters within the circuit under test which monitor similar events.

12. A method for evaluating operations of a circuit under test comprising the steps of:

generating and transmitting one or more transactions for use in testing the circuit under test generating at least one external counter value;

converting the transactions for execution by the circuit under test;

receiving the results of the executed transaction and converting the results for analysis; and monitoring the transactions generated for use in testing the circuit under test for comparison with the results of the executed transaction and the at least one external counter value.

13. The method for evaluating operation of a circuit under test of claim 12 further comprising the step of:

analyzing the results of the executed transactions by comparing the results of the executed transaction with the transactions generated for use in testing the circuit.

14. The method of claim 12 wherein the step of generating and transmitting one or more transactions for use in testing the circuit under test comprises:

generating and transmitting a programming transaction, a read transaction and one or more working transactions.

15. The method of claim 14 wherein the one or more working transactions are selected from the group consisting of: read, write and clear cache transactions.

16. A method for evaluating operation of a circuit under test comprising the steps of:
- generating and transmitting one or more working transactions for use in testing the circuit;
- initiating a first counter upon transmitting the working transaction;
- receiving a data return transaction from the circuit under test;
- stopping the first counter upon receipt of the data return transaction;
- running an internal counter within the circuit while executing the transaction;
- generating and transmitting a read transaction to the circuit under test to obtain the value of the internal counter in the circuit under test;
- receiving a read transaction result from the circuit under test, representing the value of the internal counter in the circuit under test; and
- comparing the value of the internal counter in the circuit under test with the value of the first counter to provide a measure of the operation of the circuit under test.

17. The method for evaluating operation of a circuit under test of claim 16 wherein both the first counter and the internal counter measure elapsed time between multiple events.

18. The method of claim 15 further comprising the steps of:
- monitoring the transactions generated for use in testing the circuit externally, for comparison with the results of internal counters within the circuit under test which monitor similar events;
- monitoring the events which occur within the circuit under test with internal counters; and
- comparing the internal counters and the external counters.

19. The method of evaluating operation of a circuit under test of claim 16 wherein the one or more working transactions are selected from the group consisting of: read, write, cache coherency transactions, synchronization transactions and initialization transactions.

20. The method of evaluating operation of a circuit under test of claim 16 further comprising:
- generating an error record if the value of the first counter differs from the value of the circuit counter by a significant amount.

21. The method of claim 16 wherein the circuit under test is a simulated circuit.

22. The method of claim 21 wherein the circuit under test is a Verilog model of a circuit.

23. A method for evaluating a circuit under test comprising the steps of:
- configuring the circuit to count one or more events;
- generating and transmitting one or more transactions for use in testing the circuit, thereby causing the circuit to count events during upon receipt of the transaction and continue until completion of the transaction; and
- reading the count values generated by the circuit under test.

24. The method of claim 23 wherein said method further comprises:
- generating an external counter value indicating the predicted value for each event counter in the circuit, and comparing the external counter value to the counter values read from the circuit.

25. The method of claim 24 further comprising the step of comparing the counts generated by the circuit under test with the predicted value of each event counter in the circuit.

26. The method of claim 23 wherein the step of configuring the circuit comprises:
- configuring the counter to count events that are redundant, such that one or more counter values are related.

27. The method of claim 23 wherein a secondary module communicates to the test module that secondary module's receipt of a transaction from the circuit under test and the test module increments an external counter upon receipt of that communication.

28. The method of claim 23 wherein the count values generated by the circuit under test are read directly from the circuit under test.

29. The method of claim 23 further comprising:
- stopping the counters within the circuit before reading the count values generated by the circuit under test.

* * * * *

UNITED STATES PATENT AND TRADEMARK OFFICE
CERTIFICATE OF CORRECTION

PATENT NO. : 6,557,147 B1
DATED : April 29, 2003
INVENTOR(S) : Myeong S. Lee et al.

It is certified that error appears in the above-identified patent and that said Letters Patent is hereby corrected as shown below:

Column 13,
Line 28, delete "claim 15" and insert therefor -- claim 17 --

Signed and Sealed this

Twenty-second Day of February, 2005

JON W. DUDAS
*Director of the United States Patent and Trademark Office*